United States Patent
Hu

(10) Patent No.: US 9,362,256 B2
(45) Date of Patent: Jun. 7, 2016

(54) BONDING PROCESS FOR A CHIP BONDING TO A THIN FILM SUBSTRATE

(71) Applicant: Dyi-Chung Hu, Hsinchu (TW)

(72) Inventor: Dyi-Chung Hu, Hsinchu (TW)

(*) Notice: Subject to any disclaimer, the term of this patent is extended or adjusted under 35 U.S.C. 154(b) by 0 days.

(21) Appl. No.: 14/712,406

(22) Filed: May 14, 2015

(65) Prior Publication Data

US 2016/0104690 A1 Apr. 14, 2016

Related U.S. Application Data

(63) Continuation-in-part of application No. 14/509,395, filed on Oct. 8, 2014.

(51) Int. Cl.
| | | |
|---|---|---|
| *H01L 21/00* | (2006.01) | |
| *H01L 23/12* | (2006.01) | |
| *H01L 23/00* | (2006.01) | |
| *H01L 21/56* | (2006.01) | |
| *H01L 21/78* | (2006.01) | |
| *H01L 21/683* | (2006.01) | |
| *H01L 23/498* | (2006.01) | |
| *H01L 23/31* | (2006.01) | |
| *H01L 25/03* | (2006.01) | |
| *H01L 21/48* | (2006.01) | |

(52) U.S. Cl.
CPC .............. *H01L 24/97* (2013.01); *H01L 21/561* (2013.01); *H01L 21/563* (2013.01); *H01L 21/565* (2013.01); *H01L 21/6835* (2013.01); *H01L 21/78* (2013.01); *H01L 23/3128* (2013.01); *H01L 23/3142* (2013.01); *H01L 23/49838* (2013.01); *H01L 24/81* (2013.01); *H01L 21/4846* (2013.01); *H01L 24/03* (2013.01); *H01L 25/03* (2013.01); *H01L 2221/68363* (2013.01); *H01L 2224/81191* (2013.01); *H01L 2224/81801* (2013.01)

(58) Field of Classification Search
CPC ............ H01L 21/4846; H01L 23/3128; H01L 23/3142; H01L 25/03; H01L 23/49838; H01L 24/03; H01L 21/6835
See application file for complete search history.

(56) References Cited

U.S. PATENT DOCUMENTS

| | | | | |
|---|---|---|---|---|
| 5,323,947 A * | 6/1994 | Juskey | ................... | B23K 1/203 156/297 |
| 5,510,273 A * | 4/1996 | Quinn | ................... | H01L 25/042 156/160 |
| 7,148,081 B2 * | 12/2006 | Higashino | ........... | H01L 21/6835 257/777 |
| 7,563,651 B2 * | 7/2009 | Kawata | ............... | H01L 21/4871 257/701 |
| 8,093,106 B2 * | 1/2012 | Wang | ...................... | H01L 21/56 438/120 |
| 2006/0071349 A1 * | 4/2006 | Tokushige | .......... | H01L 23/5387 257/784 |
| 2011/0068455 A1 * | 3/2011 | Wang | ...................... | H01L 21/56 257/692 |
| 2014/0102777 A1 | 4/2014 | Chen et al. | | |

* cited by examiner

*Primary Examiner* — Alonzo Chambliss
(74) *Attorney, Agent, or Firm* — Hauptman Ham, LLP

(57) ABSTRACT

A bonding process for a chip bonded to a thin film substrate is disclosed. The thin film substrate has a thickness of about less than 500 um. Curvature occurs in the thin film substrate due to Coefficient of Temperature Expansion (CTE) mismatch for different materials between the dielectric material and the embedded circuitry, where cooling and heating is applied during fabrication. A temporary carrier is prepared for the thin film substrate to paste, a flatten process is applied by a roller thereon so that the curvature of the thin film substrate can be eliminated and facilitated for of chips to be bonded thereto.

13 Claims, 24 Drawing Sheets

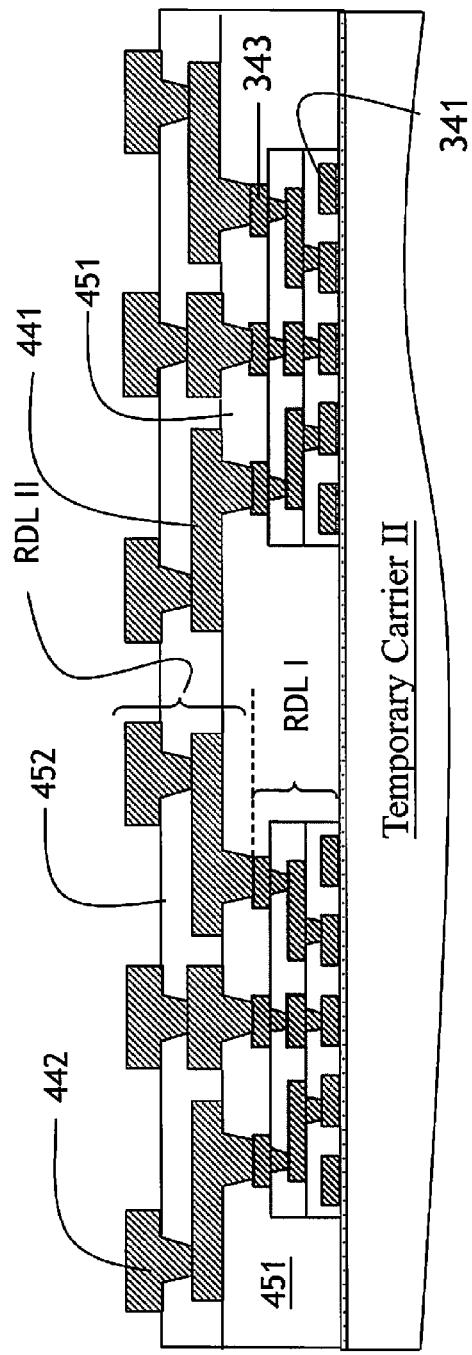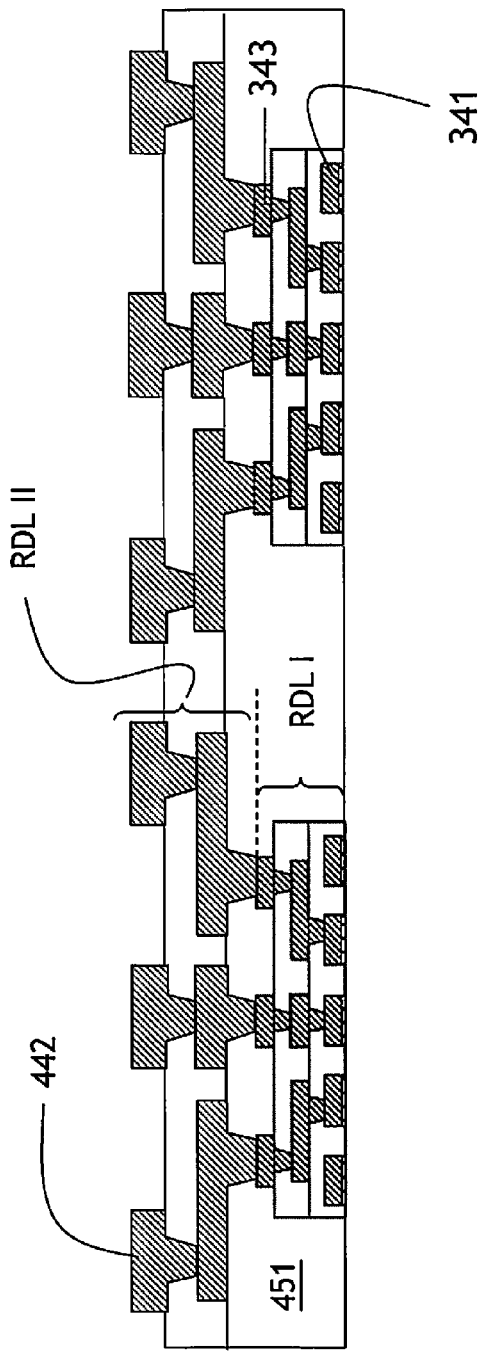
Fig.2L
Fig.2M

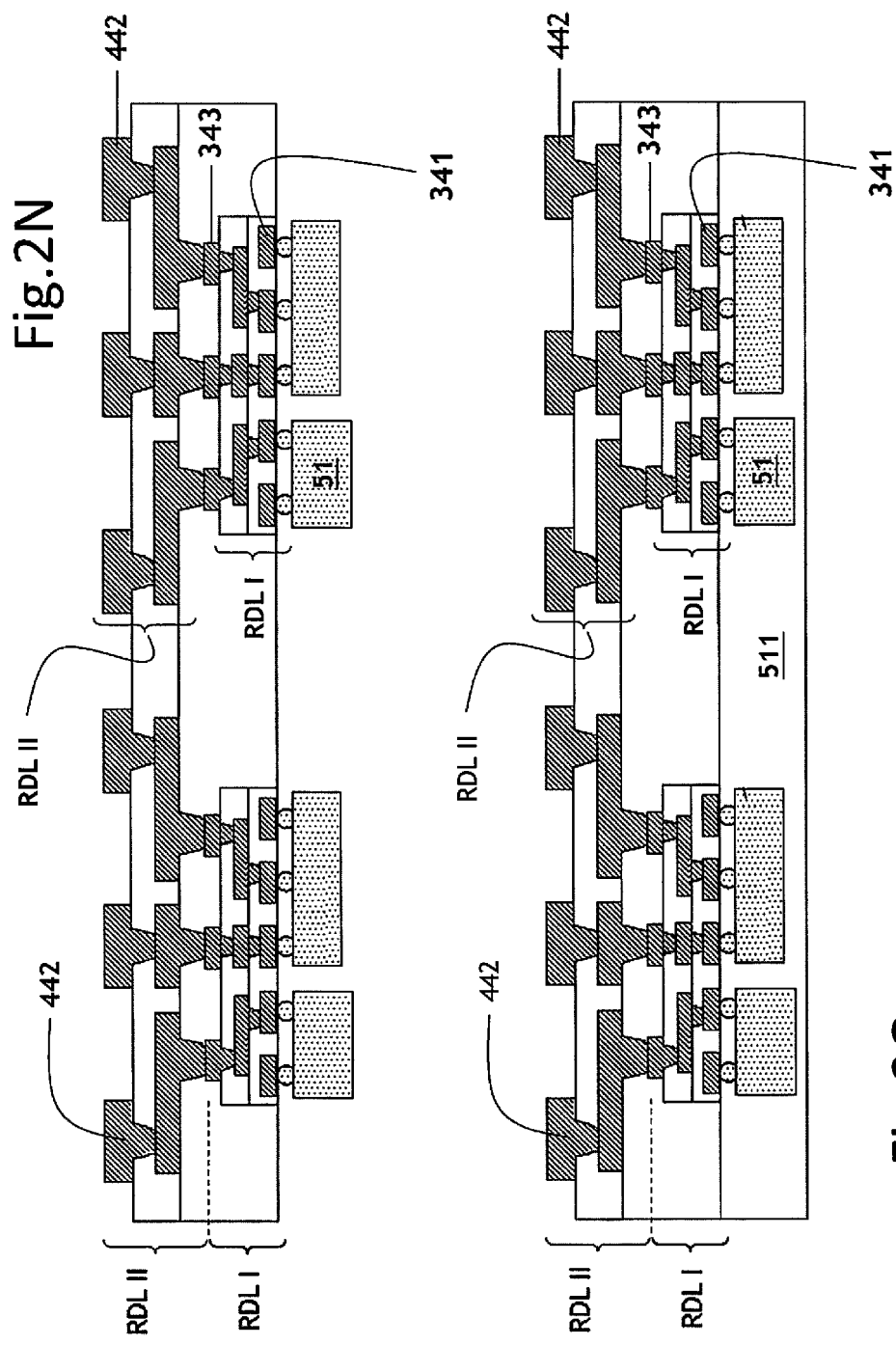

Fig.3

A process flow for fabricating a high density film, comprises:

fabricating a bottom redistribution layer RDL I following IC design rule, with a plurality of bottom pad 341 formed on bottom, and with a plurality of first top pad 343 formed on top; wherein the density of the plurality of bottom pad 341 is higher than the density of the plurality of first top pad 343; and fabricating a top redistribution layer RDL II following a PCB design rule, using the plurality of the first top pad 343 as a starting point; with a plurality of second top pad 442 formed on top; wherein a density of the plurality of first top pad 343 is higher than a density of the plurality of second top pad 442.

Fig.4

A process flow for fabricating a high density film, comprises:

preparing a temporary carrier I;
applying a first release layer 31 on top of the temporary carrier I;
forming a seed layer 32 on top of the first release layer 31;
forming a plurality of bottom pad 341 on top of the seed layer 32;
etching the seed layer 32 between the bottom pads 341;
forming a bottom redistribution layer RDL I following IC design rule, using the plurality of bottom pad 341 as a starting point; with a plurality of first top pad 343 formed on top, to form a circuitry film RDL I;
removing the temporary carrier I to release the circuitry film RDL I;
singulating the circuitry film RDL I to produce a plurality of RDL I unit preparing a temporary carrier II;
applying a second release layer 311 on top of the temporary carrier II;
arranging a plurality of the RDL I unit on top of the second release layer 311;
forming a second top redistribution layer RDL II following PCB design rule on top of the plurality of RDL I unit, using the first top pad 343 as a starting point; with a plurality of second top pad 442 formed on top; and
removing the temporary carrier II to release a high density film (RDL I + RDL II).

Fig.5

A process flow for fabricating an IC package using the high density film according to the present invention, comprises:

preparing a high density film (RDL I + RDL II) prepared according to Fig.3 or Fig.4.

mounting at least one chip 51 on bottom of the bottom pad 341;

molding the chip 51 with a molding compound 511;

thinning the molding compound 511 to reveal bottom surface of the chip 51;

mounting a heat sink 53 on bottom of the chip 51; and singulating to produce a plurality of separated unit.

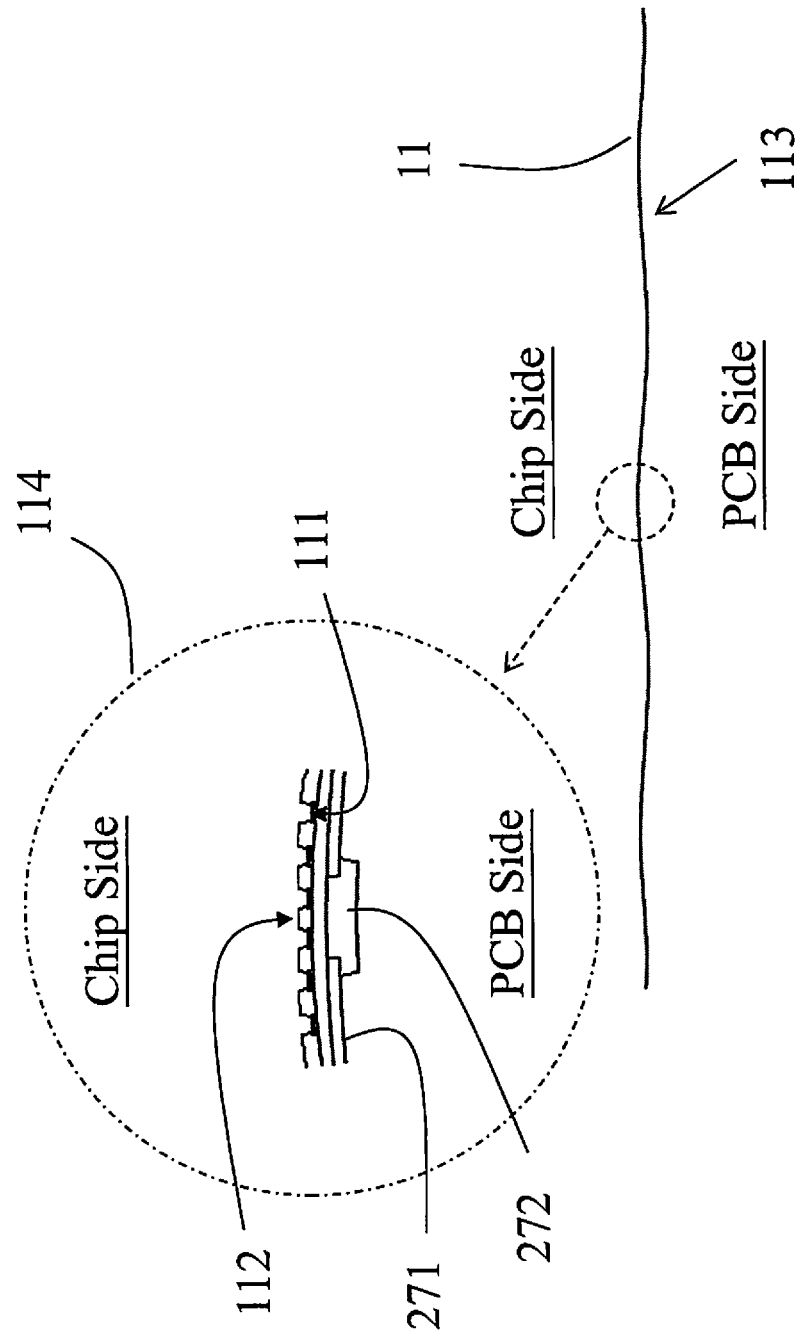

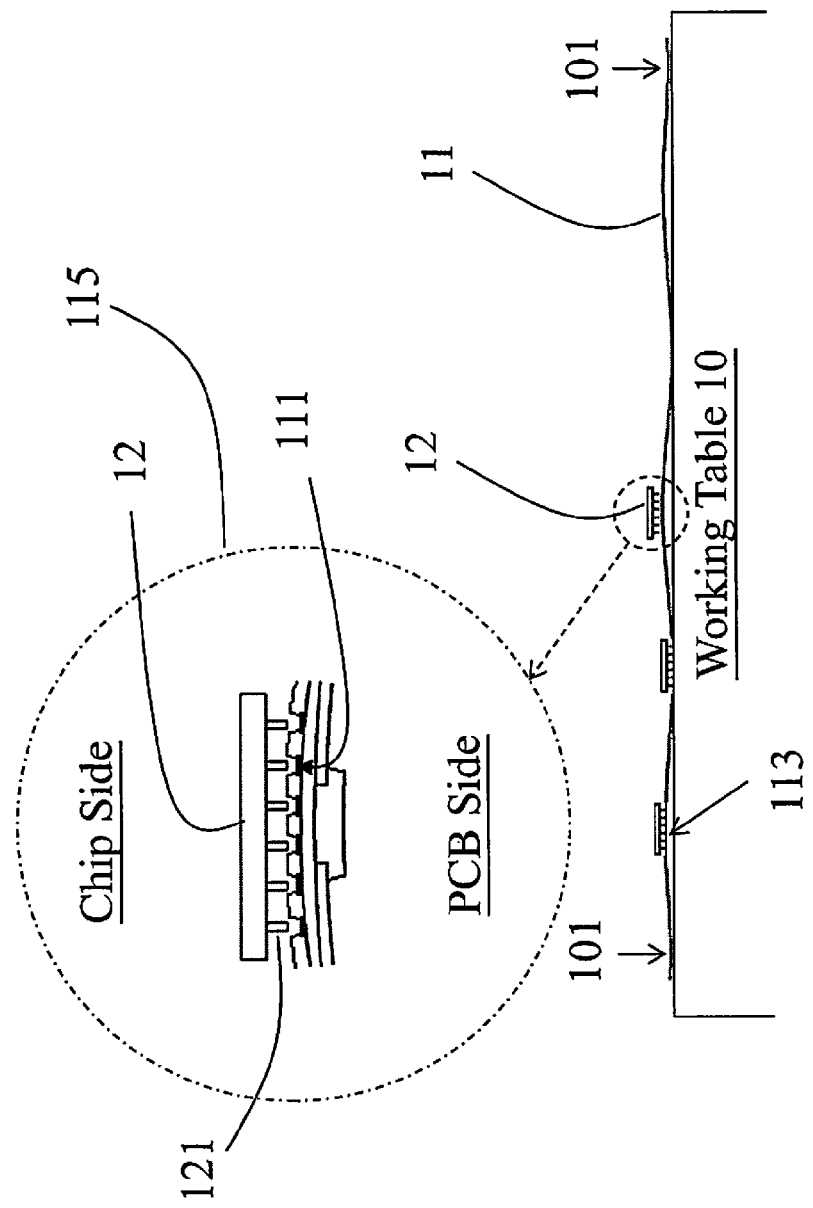

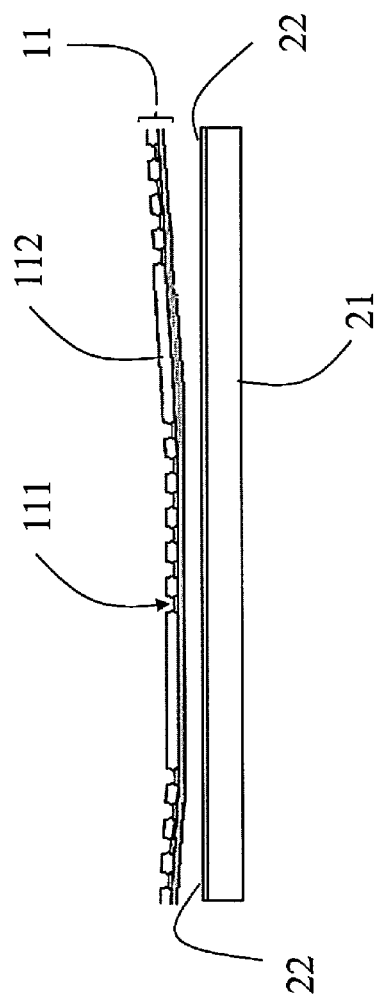
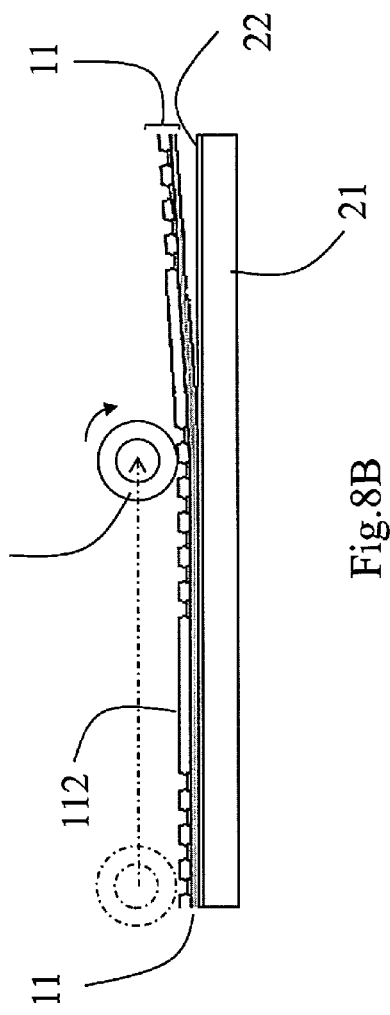

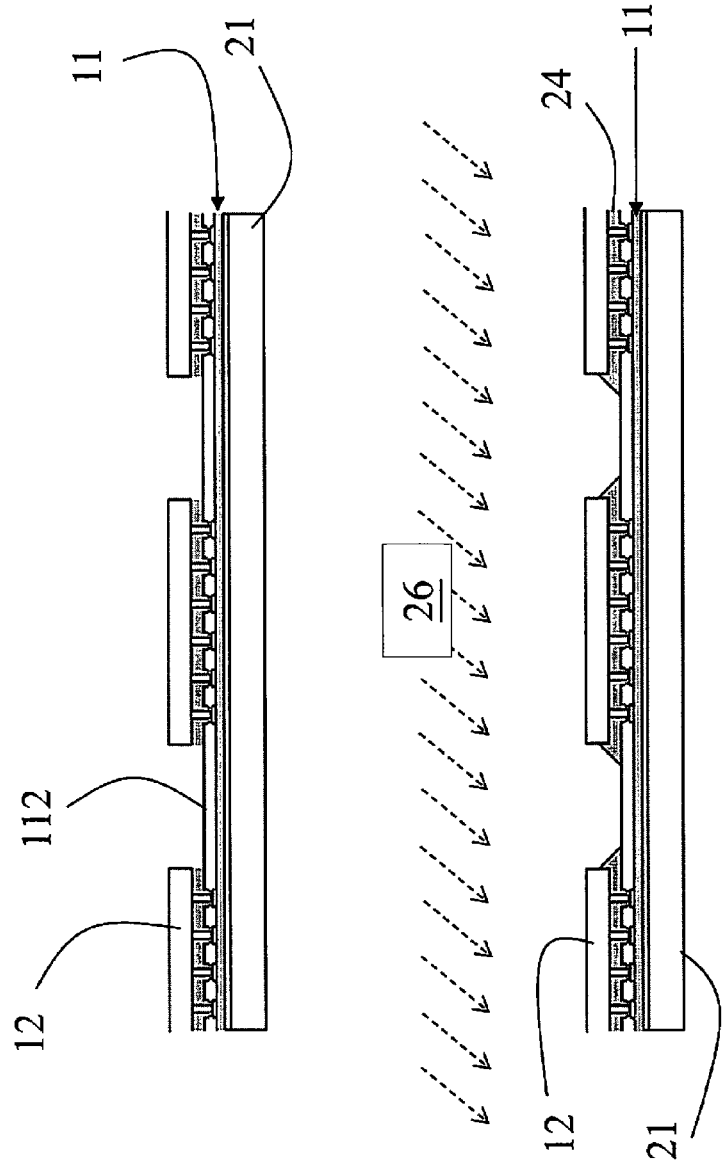

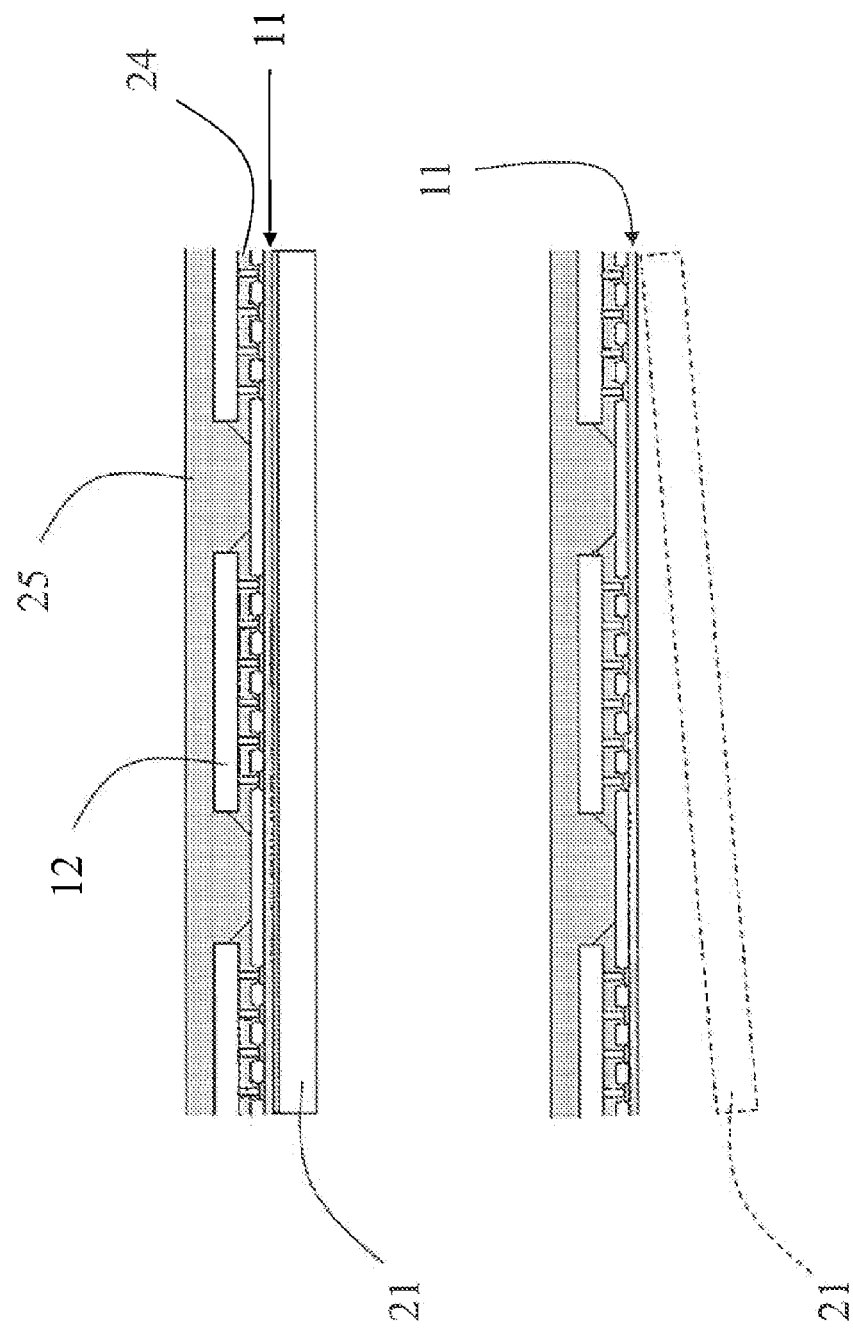

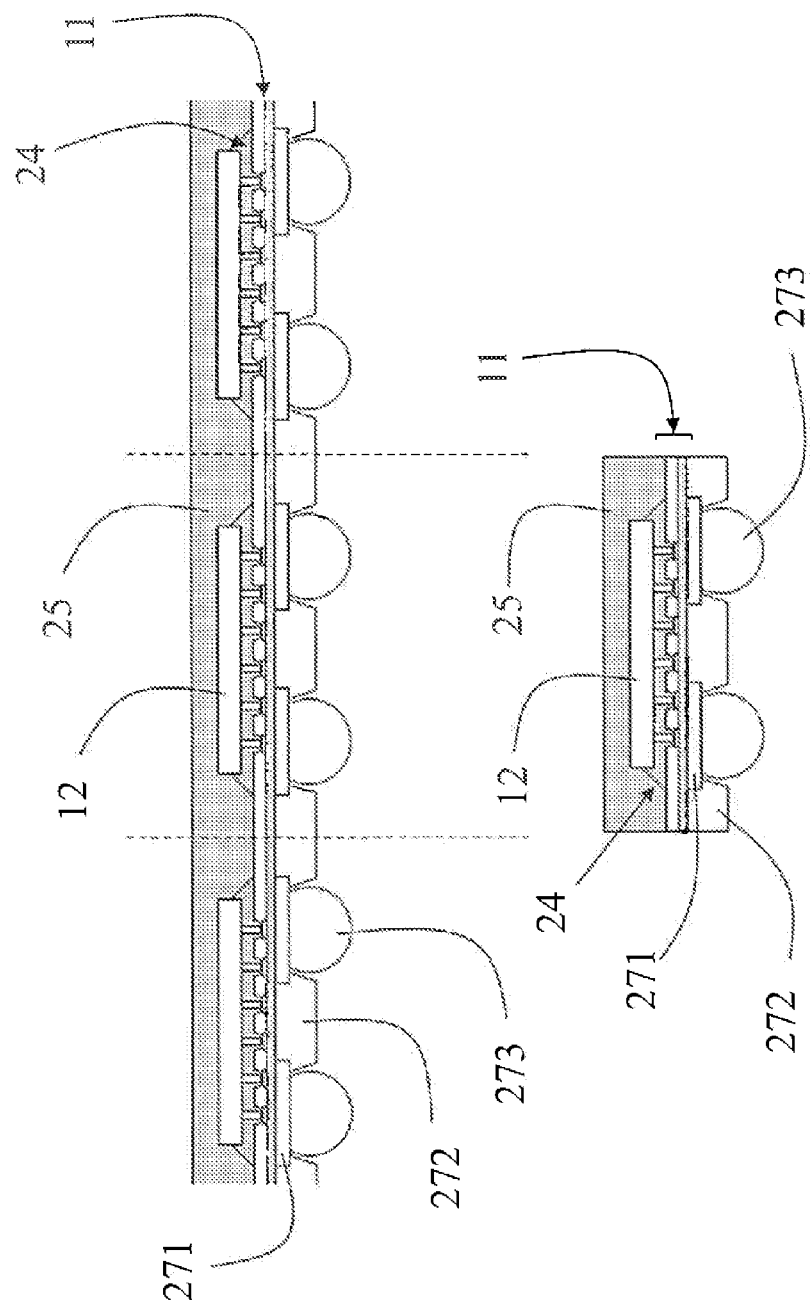

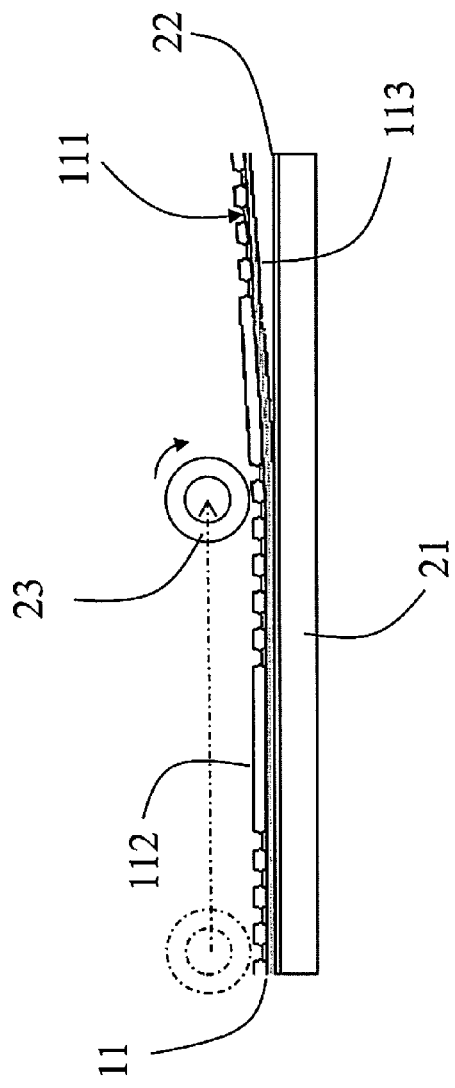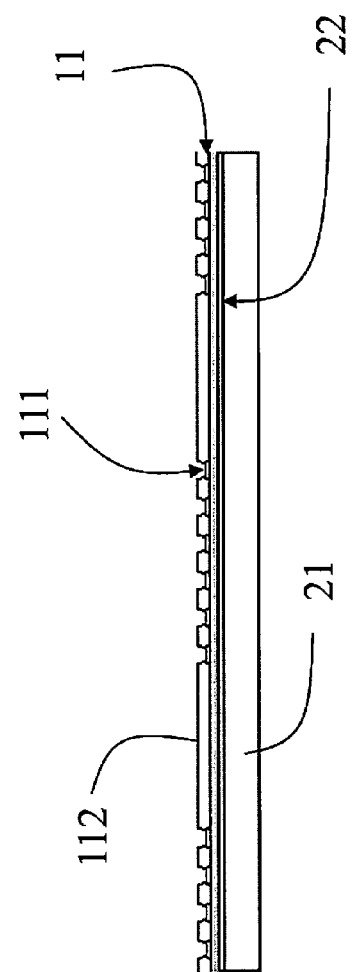

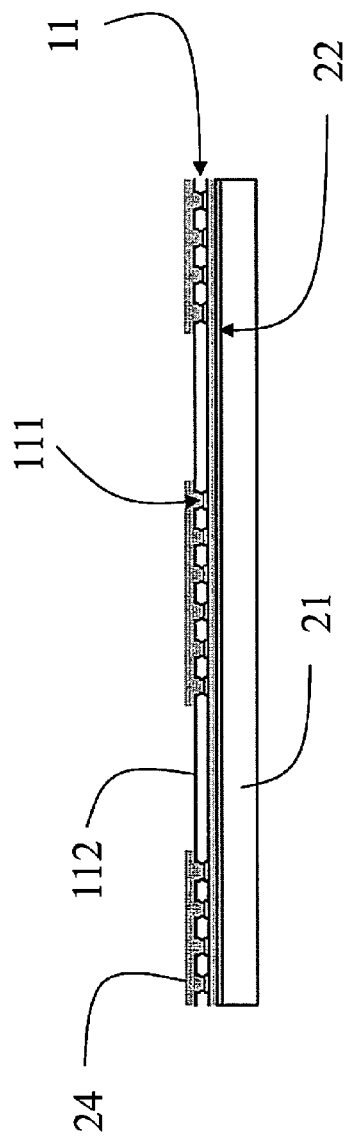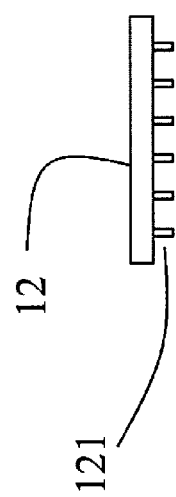

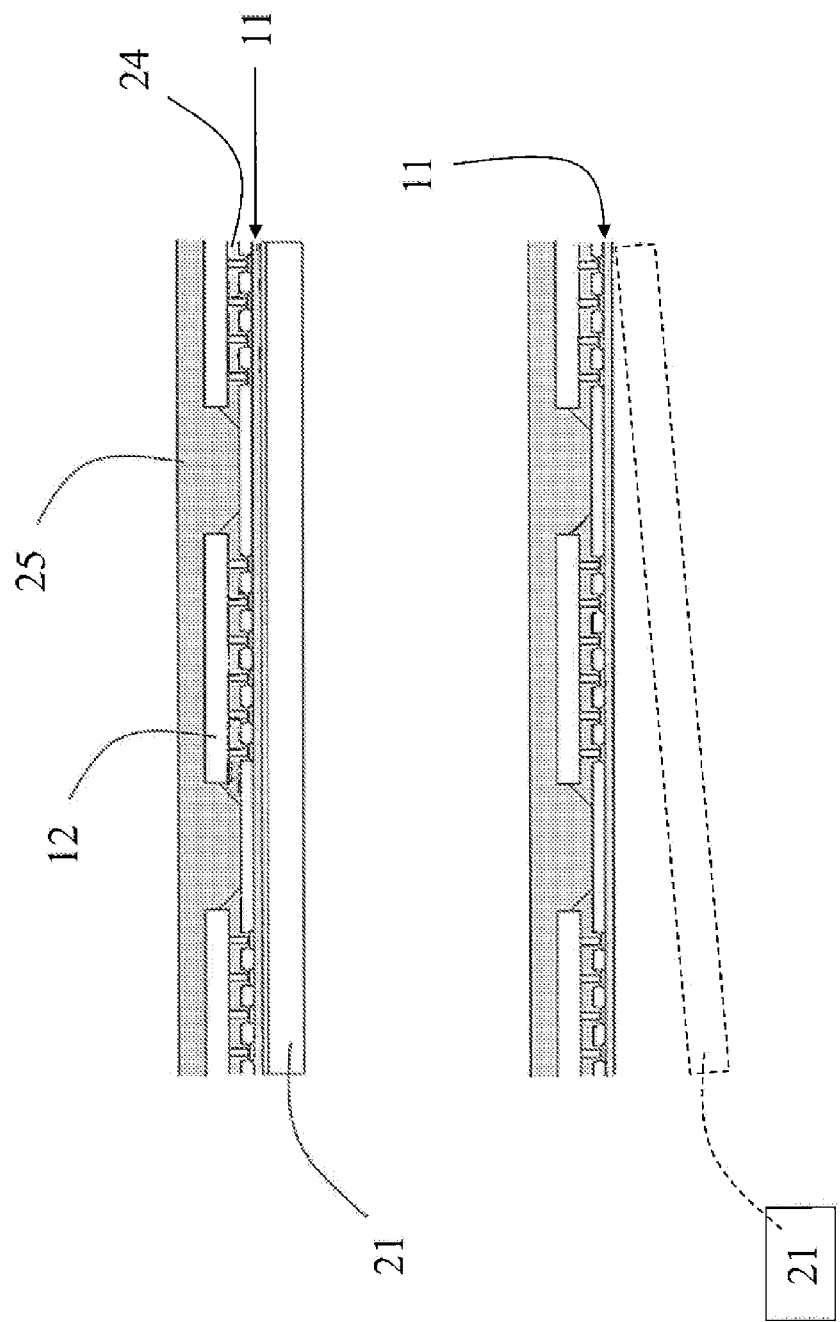

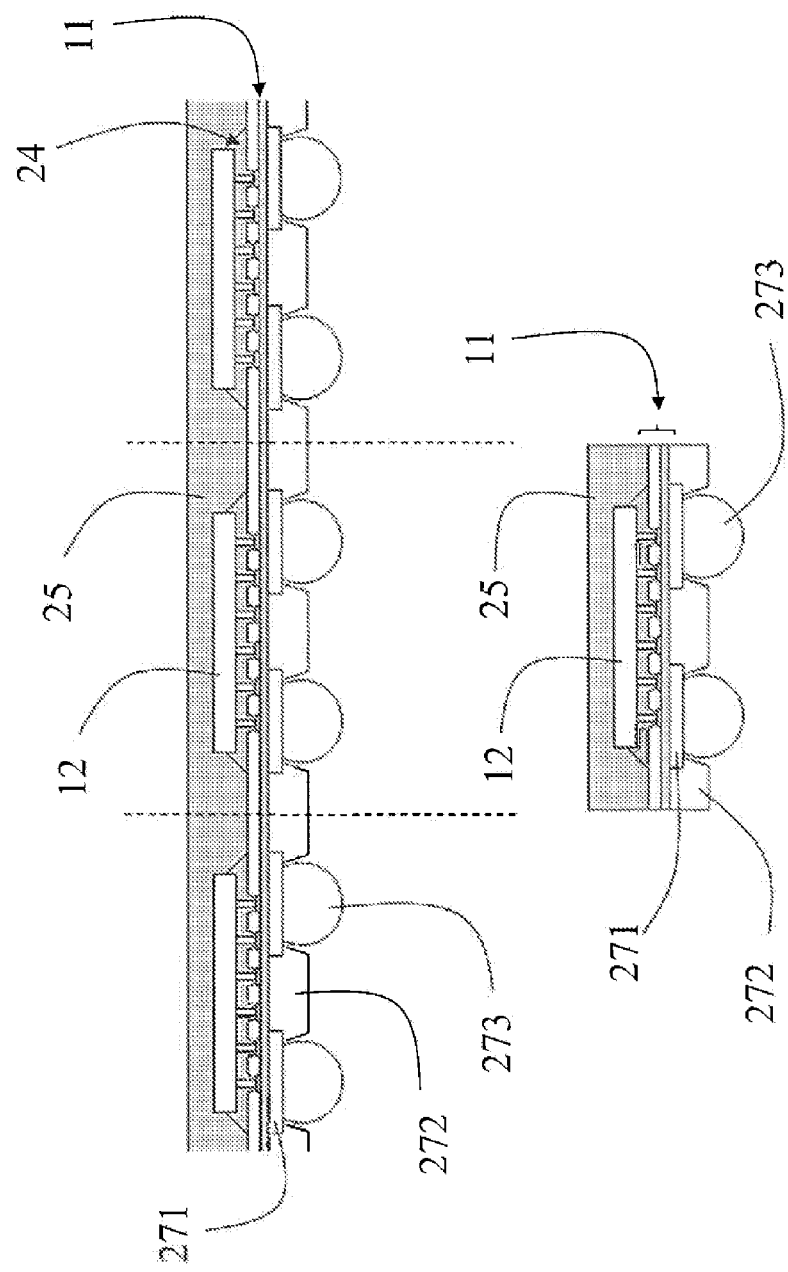

US 9,362,256 B2

BONDING PROCESS FOR A CHIP BONDING TO A THIN FILM SUBSTRATE

This application is a continuation-in-part application of U.S. application Ser. No. 14/509,395 filed Oct. 8, 2014, the disclosure of which is incorporated by reference herein in its entirety.

BACKGROUND

1. Technical Field

The present invention relates to a high density film for IC package, especially relates to a high density film without having any interposer. A traditional interposer includes such as a semiconductor interposer with through silicon via (TSV) or a glass interposer with through glass via (TGV) embedded therein.

2. Description of Related Art

FIG. 1 shows a prior art substrate for IC package

FIG. 1 shows a prior art substrate for IC package disclosed in US2014/0102777A1 which has an embedded silicon interposer 20. The silicon interposer 20 has four later sides 206. A molding compound 22 wraps the silicon interposer 20 around the four lateral sides 206. A plurality of via metal 200 is made through the silicon interposer 20. An insulation liner 201 is made between the through via 200 and the silicon interposer 20 for an electrical insulation there-between. A top redistribution layer 21 is made on top of the silicon interposer 20 with a plurality of metal pad 210 exposed on top. The plurality of metal pad 210 on top is provided for accommodating an IC chip (not shown) to mount. A circuit built-up layer 25 is made on bottom of the silicon interposer 20 with a plurality of metal pad 220 configured on bottom. A plurality of solder ball 4 is configured and each solder ball 4 is configured on bottom of a corresponding bottom metal pad 220.

BRIEF DESCRIPTION OF THE DRAWINGS

FIGS. 2A~2M show a process for fabricating a high density film according to the present invention.

FIGS. 2N~2S show an IC package using the high density film according to the present invention.

FIG. 3 shows a process flow for fabricating a high density film according to the present invention.

FIG. 4 shows a further process flow for fabricating a high density film according to the present invention.

FIG. 5 shows a process flow for fabricating an IC package using the high density film according to the present invention.

FIG. 6 shows a thin film substrate according to the present invention.

FIG. 7 shows registration problem due to the curvature of the thin film substrate.

FIGS. 8A~8J show a first bonding process according to the present invention.

FIGS. 9A~9J show a second bonding process according to the present invention.

DETAILED DESCRIPTION OF THE INVENTION

FIGS. 2A~2M show a process for fabricating a high density film according to the present invention.

Figure 1:
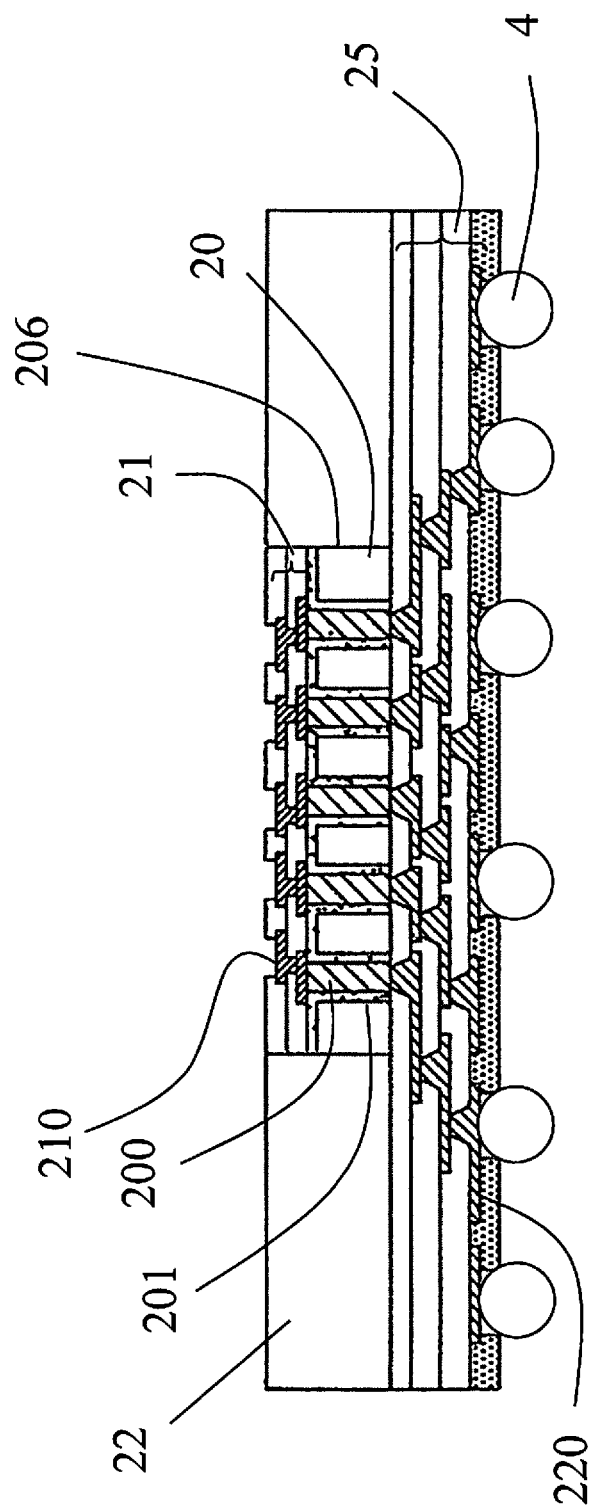
FIG. 1 shows a prior art IC package.
Figure 2A:
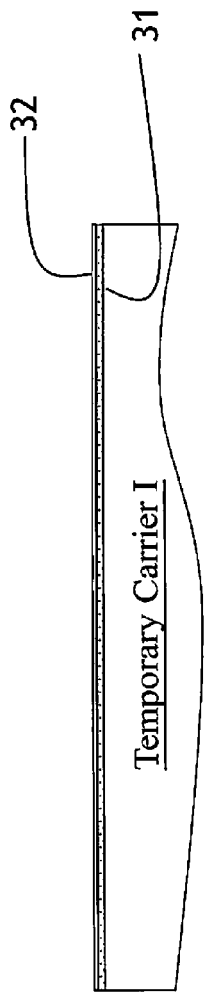

FIG. 2A shows a temporary carrier I is prepared, a first release layer 31 is applied on top of the temporary carrier I, and a seed layer 32, such Ti/Cu, is formed on top of the first release layer 31.

Figure 2B:
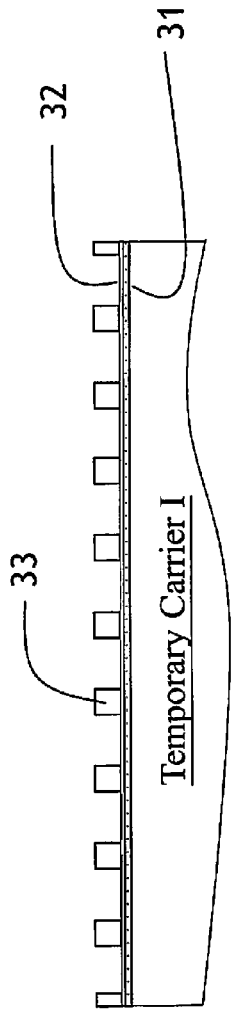

FIG. 2B shows a patterned photoresist 33 is formed on top of the seed layer 32.

Figure 2C:
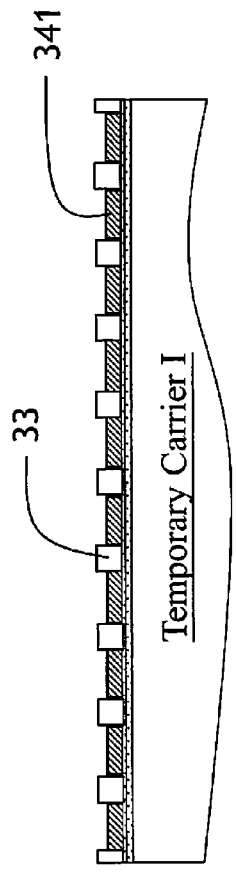

FIG. 2C shows a plurality of bottom pad 341 is formed on top of the seed layer 32.

Figure 2D:
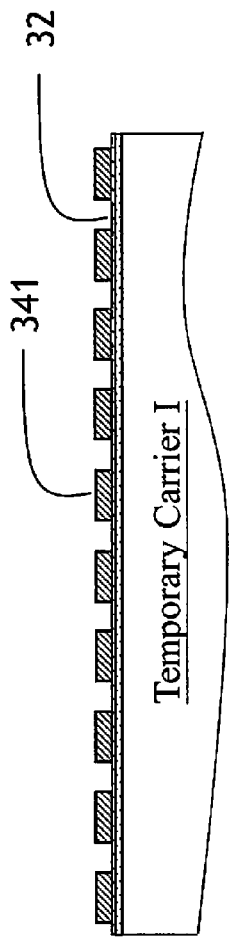

FIG. 2D shows the patterned photoresist 33 is removed and a plurality of bottom pad 341 is left.

Figure 2E:
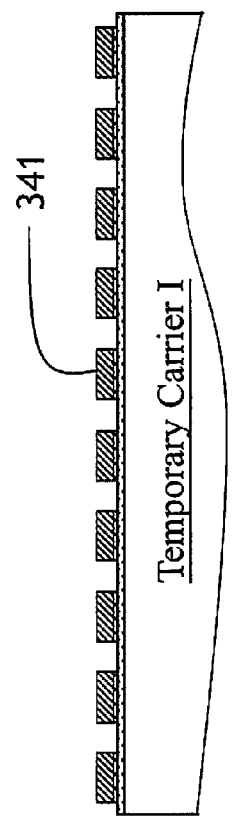

FIG. 2E shows the seed layer 32 between pads 341 are removed.

Figure 2F:
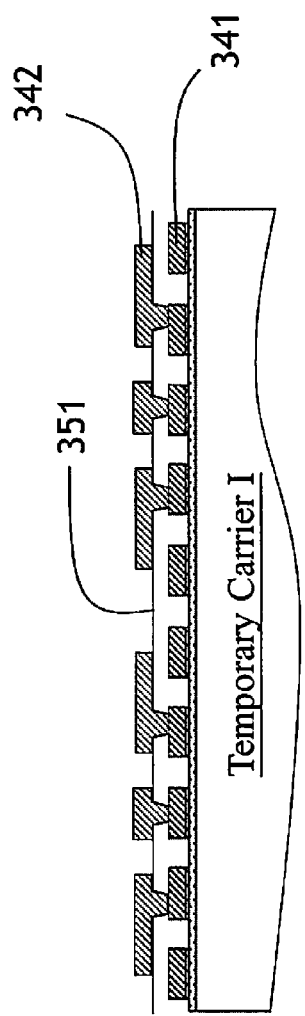

FIG. 2F shows a first redistribution circuitry 342 is formed following IC design rule, using the plurality of bottom pad 341 as a starting point, comprising the steps: a first dielectric layer 351 is applied on top of the bottom pad 341, and then a first redistribution circuitry 342 is formed through traditional technique.

Figure 2G:
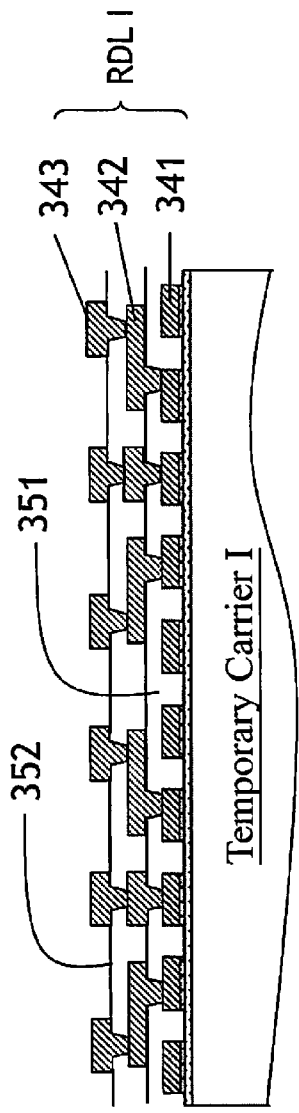

FIG. 2G shows a plurality of first top pad 343 is formed comprising the following steps: a second dielectric layer 352 is applied on top of the first redistribution circuitry 342, a plurality of first top pad 343 is formed through traditional technique. A first redistribution circuitry 342 and a plurality of first top pad 343 are exemplified in this embodiment. The redistribution circuitry layer can be repeatedly processed to even more layers to fan out the circuitry if desired. The bottom pad 341, the first redistribution circuitry 342 and the first top pad 343 are collectively called circuitry film RDL I.

Figure 2H:
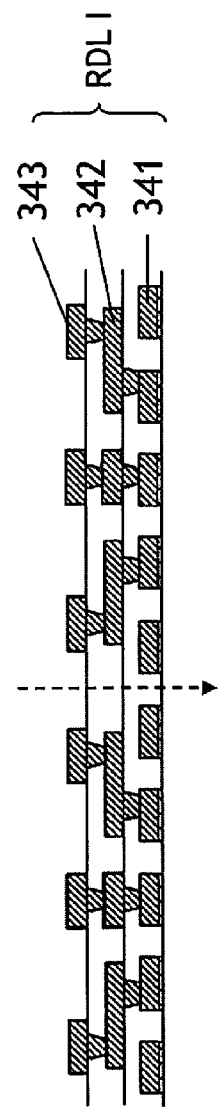

FIG. 2H shows the temporary carrier I is removed to form a circuitry film RDL I. And then a singulating process is performed to produce a plurality of single unit of circuitry film RDL I.

Figure 2I:
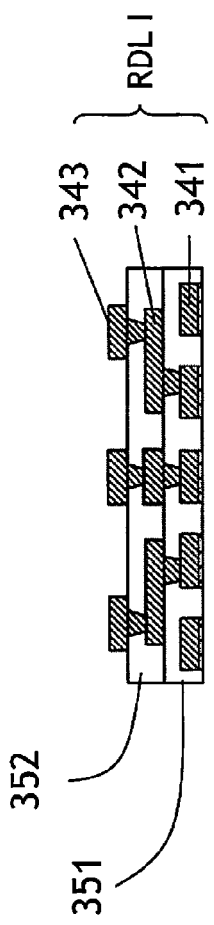

FIG. 2I shows a single unit of circuitry film RDL I.

Figure 2J:
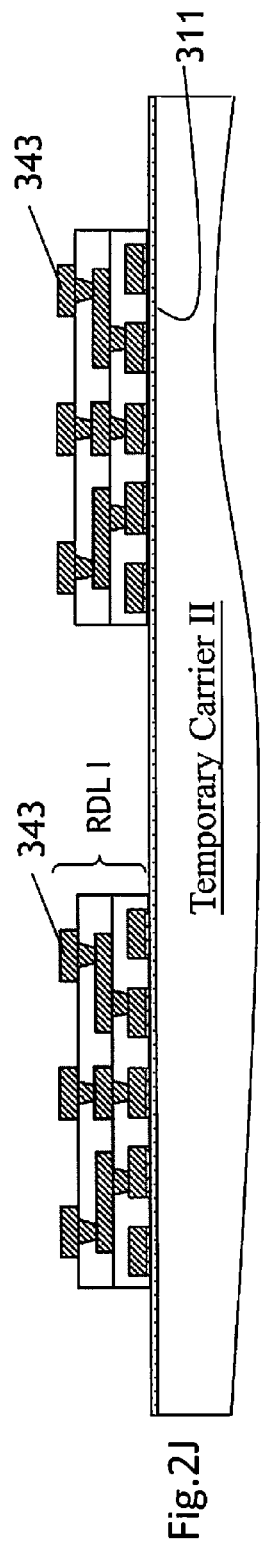

FIG. 2J shows a temporary carrier II is prepared. A second release layer 311 is applied on top of the temporary carrier II. A plurality of circuitry film RDL I is arranged on top of the second release layer 311.

Figure 2K:
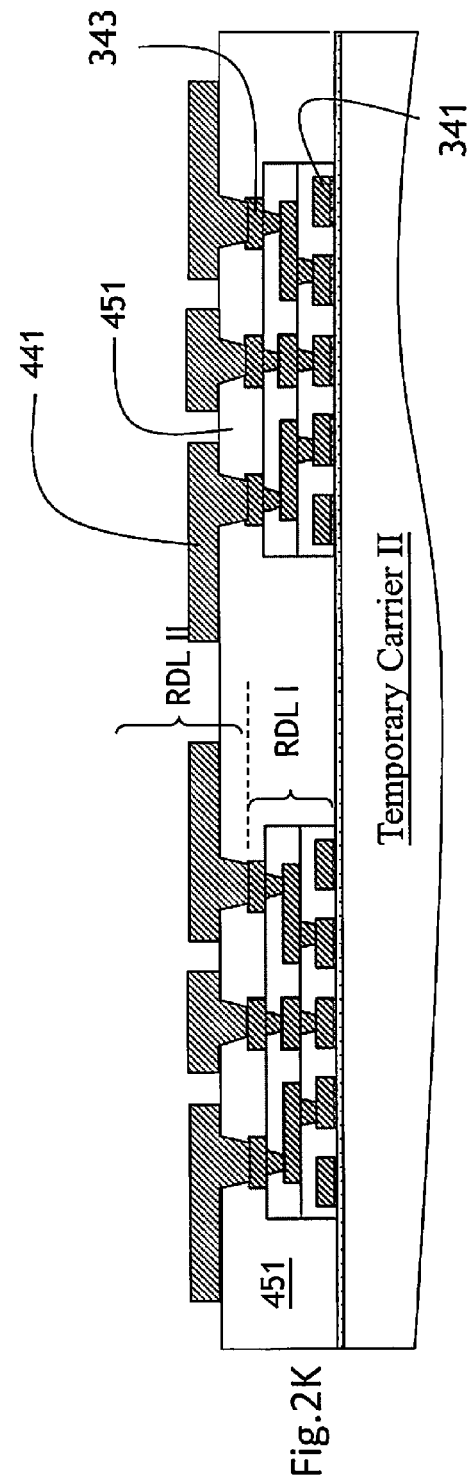

FIG. 2K shows a second redistribution circuitry 441 is formed following PCB design rule, using the plurality of first top pad 343 as a starting point, comprising the steps: a third dielectric layer 451 is applied on top of the circuitry film RDL I, and then a second redistribution circuitry 441 is formed through traditional technique.

The dielectric layer used for PCB process can be one of Ajinomoto build-up films (ABF) or Pre-preg (PP).

FIG. 2L shows a plurality of second top pad 442 is formed, comprising the steps: a fourth dielectric layer 452 is applied on top of the second redistribution circuitry 441 and the third dielectric layer 451, a plurality of second top pad 442 is formed through traditional technique. A second redistribution circuitry 441 and a plurality of second top pad 442 are exemplified in this embodiment. The redistribution circuitry can be repeatedly processed to even more layers to fan out the circuitry if desired. The redistribution circuitry 441 and the second top pad 442 are collectively called circuitry film RDL II. A high density film (RDL I+RDL II) is formed on top of the second release layer 311.

FIG. 2M shows the temporary carrier II is removed, and a high density film (RDL I+RDL II) is released.

FIGS. 2N-2S show a fabricating process for an IC package using the high density film according to the present invention.

FIG. 2N shows at least one chip 51 is mounted on a bottom of the bottom pad 341.

FIG. 2O shows a molding compound 511 is applied to encapsulate the chip or chips 51.

Figure 2P:
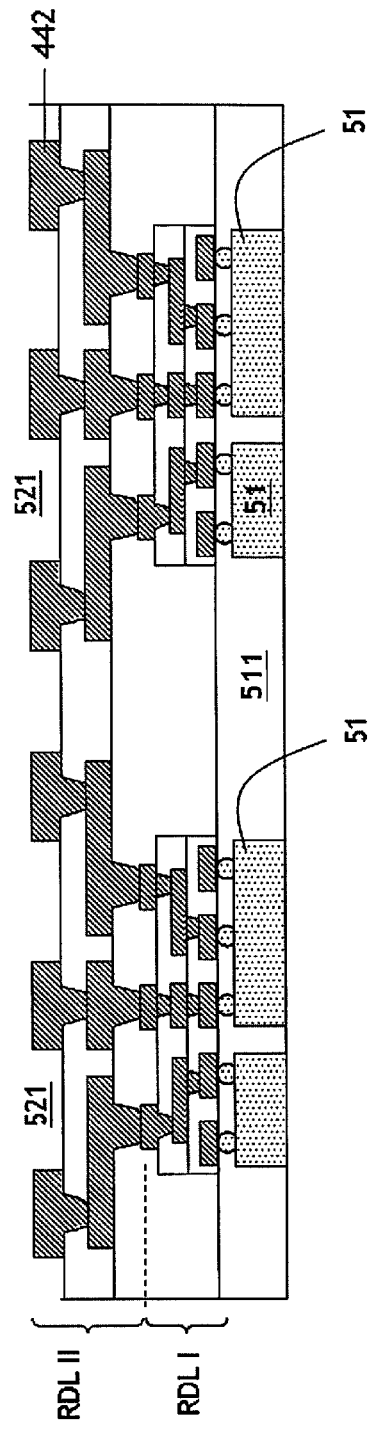

FIG. 2P shows a thinning process is applied onto the molding compound 511 to reveal a bottom surface of the chip 51 for heat dissipation of the chip.

Figure 2Q:
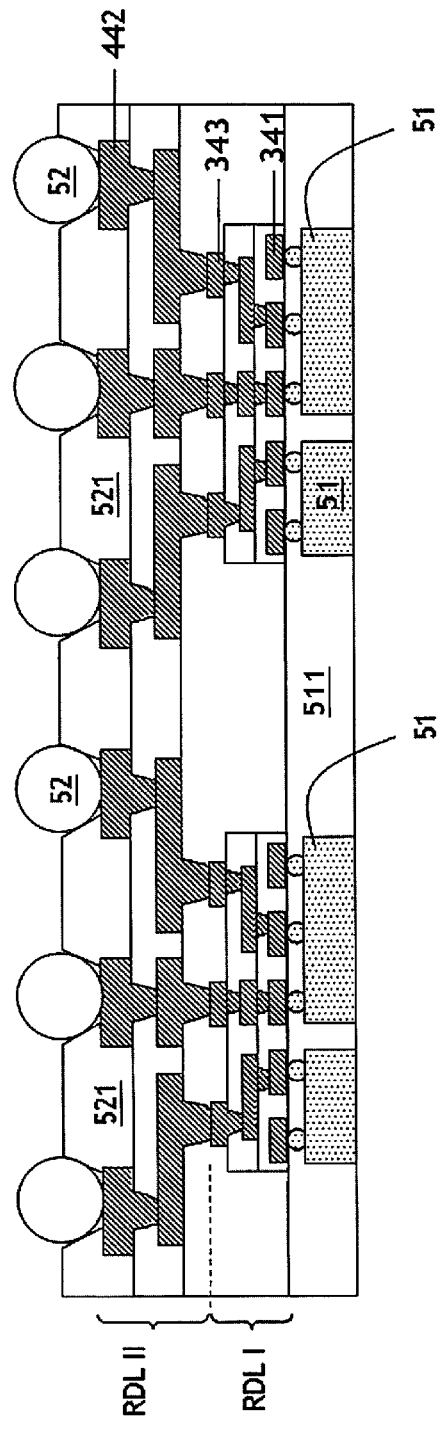

FIG. 2Q shows a dielectric layer 521 is applied between the second top pads 442, and a plurality of solder ball 52 is planted, each solder ball 52 is configured on top of a corresponding top pad 442.

Figure 2R:
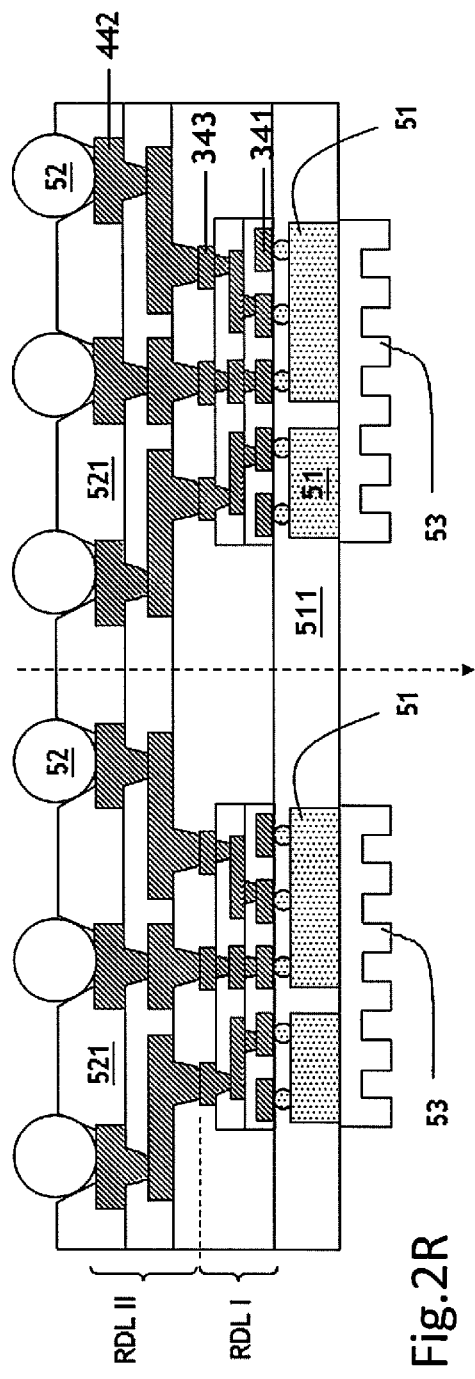

FIG. 2R shows a heat sink 53 is configured on a bottom surface of the chip 51 for further heat dissipation.

Figure 2S:
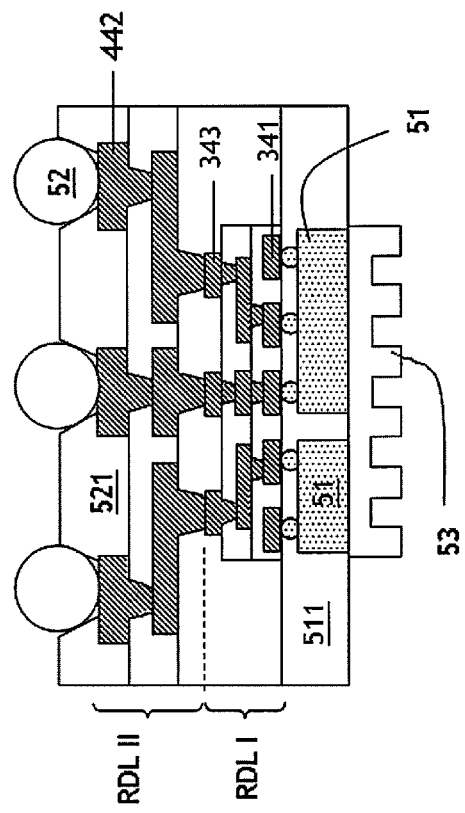
Figure 8C:
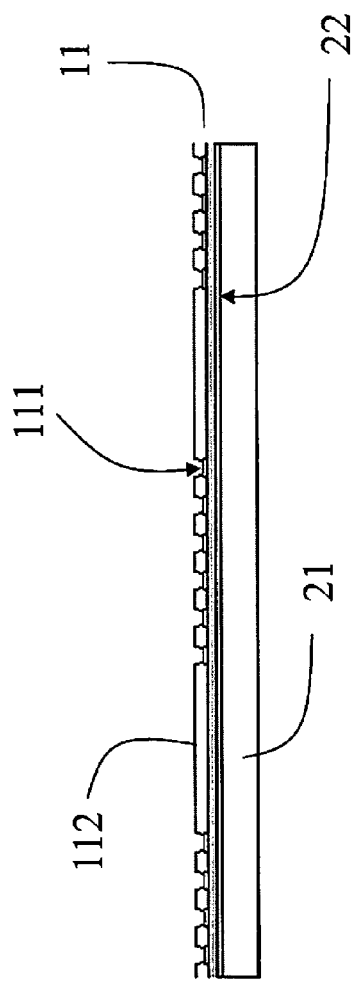
Figure 8D:
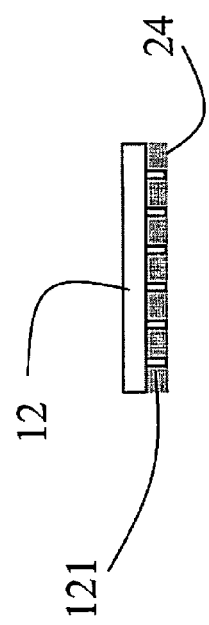
Figure 9E:
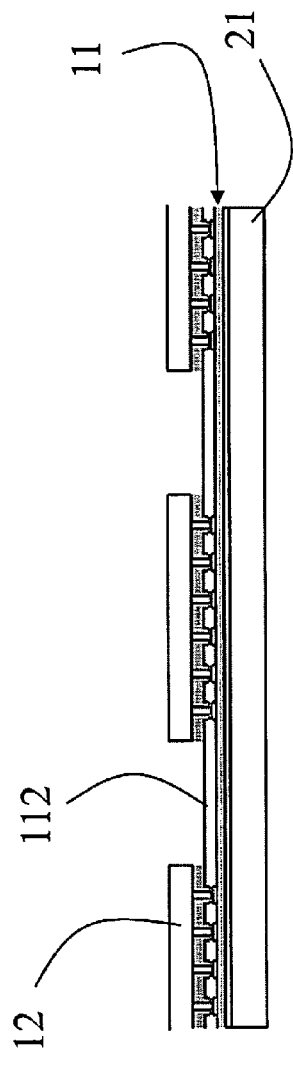
Figure 9F:
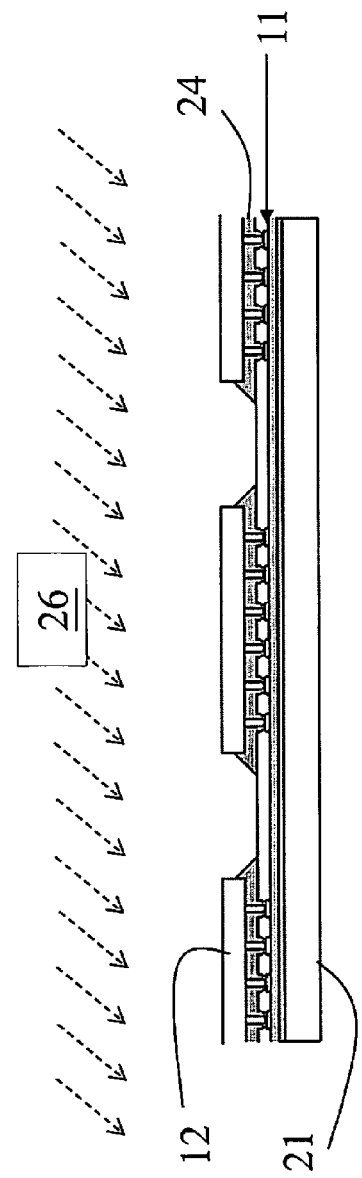

FIG. 2S shows a single unit of the IC package is formed after a singulating process applied on the product of FIG. 2R.

FIG. 3 shows a process flow for fabricating a high density film according to the present invention, comprises:

fabricating a bottom redistribution layer RDL I following IC design rule, with a plurality of bottom pad 341 formed on bottom, and with a plurality of first top pad 343 formed on top; wherein the density of the plurality of bottom pad 341 is higher than the density of the plurality of first top pad 343; and fabricating a top redistribution layer RDL II following PCB design rule, using the plurality of the first top pad 343 as a starting point; with a plurality of second top pad 442 formed on top; wherein a density of the plurality of first top pad 343 is higher than a density of the plurality of second top pad 442.

FIG. 4 shows a further process flow for fabricating a high density film, comprises:

preparing a temporary carrier I;

applying a first release layer 31 on top of the temporary carrier I;

forming a seed layer 32 on top of the first release layer 31;

forming a plurality of bottom pad 341 on top of the seed layer;

etching the seed layer between the bottom pads 341;

forming a bottom redistribution layer RDL I following IC design rule, using the bottom pad 341 as a starting point; with a plurality of first top pad 343 formed on top, to form circuitry film RDL I;

removing the temporary carrier I to release the circuitry film RDL I;

singulating the circuitry film RDL I to produce a plurality of RDL I unit preparing a temporary carrier II;

applying a second release layer 311 on top of the temporary carrier II;

arranging a plurality of the RDL I unit on top of the second release layer 311;

forming a second top redistribution layer RDL II following PCB design rule on top of the plurality of RDL I unit, using the first top pad 343 as a starting point; with a plurality of second top pad 442 formed on top; and removing the temporary carrier II to release a high density film (RDL I+RDL II).

FIG. 5 shows a process flow for fabricating an IC package using the high density film according to the present invention, comprises:

removing the temporary carrier I to release the bottom redistribution layer RDL I;

singulating the bottom redistribution layer RDL I to produce a plurality of RDL I unit;

preparing a temporary carrier II;

applying a second release layer 311 on top of the temporary carrier II;

arranging a plurality of the RDL I unit on a top of the second release layer 311;

forming a second top redistribution layer RDL II following PCB design rule on top of the plurality of RDL I unit, using the plurality of first top pad 343 as a starting point; with a plurality of second top pad 442 formed on top;

removing the temporary carrier II to release a high density film (RDL I+RDL II);

mounting at least one chip 51 on bottom of the plurality of bottom pad 341;

molding the chip 51 with a molding compound 511;

thinning the molding compound 511 from bottom to reveal the bottom surface of the chip 51;

mounting a heat sink 53 on bottom of the chip 51; and singulating to produce a plurality of separated unit.

FIG. 6 shows a thin film substrate according to the present invention.

FIG. 6 shows a thin film substrate 11 which has a plurality of substrate units for chips to package. The thin film substrate 11 is fabricated the same as, or similar to, the process fabricating the thin film substrate of FIG. 2M.

Since the thin film substrate 11 has a thickness of about 50-200 um, some curvature 113 may exists due to Coefficient of Temperature Expansion (CTE) mismatch of the dielectric material and the embedded circuitry to which cooling and heating applied during its fabrication process.

An enlarged view of the thin film substrate 11 is shown in a circle 114, the thin film substrate 11 has a plurality of top pads 111 adapted for a chip to be electrically coupled to. A solder mask 112 is applied on a top surface of the thin film substrate 11 to expose a central area of each top pad 111. The thin film substrate 11 has a plurality of bottom pads 271. A solder mask 272 is applied to cover the bottom side of the thin film substrate 11 to expose a central area of the bottom pads 271 so that a solder ball 273 can be planted on a corresponding bottom pad 271 in a later process; wherein a density of the top pads is higher than a density of the bottom pads.

The top side of the thin film substrate 11 is a pad high density side for a chip to mount thereon and therefore also called a chip side. In the meanwhile, the bottom side of the thin film substrate 11 is a pad low density side fabricated for the package mounting to printed circuit board and therefore also called a PCB side.

FIG. 7 shows registration problem due to the curvature of the thin film substrate.

FIG. 7 shows that curvature 113 is shown with the thin film substrate 11 fixed on a working table 10 with fixtures to fix at points 101. An enlarged view in the circle area 115 shows that a chip 12 has a plurality of metal pillars 121 on bottom. A registration problem, electrically coupling, or bonding problem occurs while the metal pillars 121 are aligned with the top pads 111 due to the curvature 113 of the thin film substrate 11. For example, the metal pillars at two ends can not contact the bottom pads 111 while the middle metal pillars contact the bottom pad 111 due to curvature 113 of the thin film substrate 11.

FIGS. 8A~8J show a first bonding process according to the present invention.

For simplification and better understanding to the reader, the dimensions for the elements in the figures are not in scale, and partial elements are omitted in some of the figures, for example, bottom pads 271 and solder mask 272 are not shown in FIGS. 8A~8H, and 9A~9H.

FIG. 8A shows:

preparing a thin film substrate 11 which has curvature 113, the thin film substrate 11 has a plurality of top pads 111 and has a plurality of bottom pads 271; a density of the top pads 111 is higher than a density of the bottom pads 271;

preparing a temporary carrier 21;

applied adhesive layer 22 on a top surface of the temporary carrier 21;

FIG. 8B shows:

pasting the thin film substrate 11 on a top surface of the adhesive layer 22; and flattening the thin film substrate 11 with a roller 23 so that the thin film substrate 11 is flattened to eliminate the curvature 113 of the thin film substrate 11;

FIG. 8C shows:

a flattened thin film substrate 11 is configured on the top surface of the temporary carrier 21 with the adhesive layer 22 sandwiched in between the thin film substrate 11 and the temporary carrier 21;

FIG. 8D shows:

preparing a plurality of chips 12, each chip 12 has a plurality of metal pillars 121 on bottom and an underfill material 24 wrapping the metal pillars 121 on bottom; and each chip 12 has a plurality of metal pillars 121 configured on bottom;

FIG. 8E shows:

placing the plurality of chips 12 onto the flattened thin film substrate 11;

FIG. 8F shows:

heating to bound the chips 12 to the thin film substrate 11 with heat 26;

FIG. 8G shows:

molding the chips 12 to form a package sheet with a molding compound 25;

FIG. 8H shows:

releasing the package sheet from the temporary carrier 21;

FIG. 8I shows:

forming solder mask 272 on bottom of the thin film substrate 11 and exposing a bottom surface of each bottom pad 271;

FIG. 8J shows:

singulating the package sheet to produce a plurality of package units.

Each package unit comprises a chip 12 embedded in the molding compound 25. Underfill 24 is configured in a space between the chip 12 and the thin film substrate 11. Chip 12 is bonded to the thin film substrate 11 through metal pillars 121 electrically coupled to the top pads 111. A plurality of bottom pads 271 is configured on a bottom surface of the thin film substrate 11. A solder ball 273 is configured on a bottom surface of a corresponding bottom pad 272.

FIGS. 9A~9J show a second bonding process according to the present invention.

FIG. 9A shows:

preparing a thin film substrate 11 which has curvature 113, the thin film substrate 11 has a plurality of top pads 111 and has a plurality of bottom pads 271 (FIG. 7); a density of the top pads 111 is higher than a density of the bottom pads 271 (FIG. 7);

preparing a temporary carrier 21;

applied adhesive layer 22 on a top surface of the temporary carrier 21;

pasting the thin film substrate 11 on a top surface of the adhesive layer 22; and flattening the thin film substrate 11 with a roller 23 so that the thin film substrate 11 is flattened to eliminate the curvature 113 of the thin film substrate 11;

FIG. 9B shows:

a flattened thin film substrate 11 is configured on the top surface of the temporary carrier 21 with the adhesive layer 22 sandwiched in between the thin film substrate 11 and the temporary carrier 21;

FIG. 9C shows:

applying underfill material 24 on top surface on the thin film substrate 11;

FIG. 9D shows:

preparing a plurality of chips 12, each chip 12 has a plurality of metal pillars configured on bottom;

FIG. 9E shows:

placing the plurality of chips 12 onto the flattened thin film substrate 11;

FIG. 9F shows:

heating to bound the chips 12 to the thin film substrate 11 with heat 26;

FIG. 9G shows:

molding the chips 12 to form a package sheet with a molding compound 25;

FIG. 9H shows:

releasing the package sheet from the temporary carrier 21;

FIG. 9I shows:

forming solder mask 272 on bottom of the thin film substrate 11 and exposing a bottom surface of each bottom pad 271;

FIG. 9J shows:

singulating the package sheet to produce a plurality of package units.

Each package unit comprises a chip 12 embedded in the molding compound 25. Underfill 24 is configured in a space between the chip 12 and the thin film substrate 11. Chip 12 is bonded to the thin film substrate 11 through metal pillars 121 electrically coupled to the top pads 111. A plurality of bottom pads 271 is configured on a bottom surface of the thin film substrate 11. A solder ball 273 is configured on a bottom surface of a corresponding bottom pad 272.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A bonding process for a chip bonded to a thin film substrate, comprises:
    preparing a thin film substrate which has curvature, the thin film substrate has a plurality of top pads and has a plurality of bottom pads; a density of the top pads is higher than a density of the bottom pads;
    preparing a temporary carrier;
    applied adhesive layer on a top surface of the temporary carrier;
    pasting the thin film substrate on a top surface of the adhesive layer; and
    flattening the thin film substrate.

2. A bonding process for a chip bonded to a thin film substrate as claimed in claim 1, further comprising:
    preparing a plurality of chips, each chip has a plurality of metal pillars on bottom and an underfill wrapping the metal pillars; and each chip has a plurality of bonding elements configured on bottom;
    placing the plurality of chips onto the flattened thin film substrate; and
    heating to bound the chips to the thin film substrate.

3. A bonding process for a chip bonded to a thin film substrate as claimed in claim 2, further comprising:
    molding the chips to form a package sheet;
    releasing the package sheet from the temporary carrier;
    forming solder mask on bottom of the thin film substrate and exposing a bottom surface of each bottom pad; and
    singulating the package sheet to produce a plurality of package units.

4. A bonding process for a chip bonded to a thin film substrate as claimed in claim 1, wherein the thin film substrate has a thickness less than 500 um.

5. A bonding process for a chip bonded to a thin film substrate as claimed in claim 1, wherein the thin film substrate is a redistribution layer.

6. A bonding process for a chip bonded to a thin film substrate as claimed in claim 1, wherein the chip is one of microchip and nanochip.

7. A bonding process for a chip bonded to a thin film substrate as claimed in claim 1, wherein the bonding element of the chip is a metal pillar.

8. A bonding process for a chip bonded to a thin film substrate as claimed in claim 1, further comprising:
   preparing a plurality of chips, each chip has a plurality of bonding elements on bottom;
   applying underfill material on top surface on the thin film substrate;
   placing the plurality of chips onto the flattened thin film substrate;
   heating to bound the chips to the thin film substrate.

9. A bonding process for a chip bonded to a thin film substrate as claimed in claim 8, further comprising:
   molding the chips to form a package sheet;
   releasing the package sheet from the temporary carrier;
   forming solder mask on bottom of the thin film substrate and exposing a bottom surface of each bottom pad;
   singulating the package sheet to produce a plurality of package units.

10. A bonding process for a chip bonded to a thin film substrate as claimed in claim 8, wherein the thin film substrate has a thickness less than 500 um.

11. A bonding process for a chip bonded to a thin film substrate as claimed in claim 8, wherein the thin film substrate is a redistribution layer.

12. A bonding process for a chip bonded to a thin film substrate as claimed in claim 8, wherein the chip is one of microchip and nanochip.

13. A bonding process for a Chip bonded to a thin film substrate as claimed in claim 8, wherein the bonding element of the chip is a metal pillar.

* * * * *